United States Patent [19]

Flanner

[11] Patent Number: 4,987,099

[45] Date of Patent: Jan. 22, 1991

[54] METHOD FOR SELECTIVELY FILLING CONTACTS OR VIAS OR VARIOUS DEPTHS WITH CVD TUNGSTEN

[75] Inventor: Janet Flanner, Union City, Calif.

[73] Assignee: North American Philips Corp., New York, N.Y.

[21] Appl. No.: 459,047

[22] Filed: Dec. 29, 1989

[51] Int. Cl.⁵ .......................................... H01L 21/48
[52] U.S. Cl. .................................. 437/192; 437/245; 437/246; 437/228
[58] Field of Search ............... 437/192, 195, 190, 245, 437/246, 228

[56] References Cited

U.S. PATENT DOCUMENTS

| | | | |
|---|---|---|---|
| 3,970,486 | 7/1976 | Kooi | 148/187 |
| 4,005,470 | 1/1977 | Tucci et al. | 357/36 |
| 4,018,627 | 4/1977 | Polata | 148/1.5 |
| 4,111,724 | 9/1978 | Ogiue et al. | 148/175 |
| 4,141,022 | 2/1979 | Sigg et al. | 357/23 |
| 4,213,818 | 7/1980 | Lemons et al. | 156/643 |
| 4,317,690 | 3/1982 | Koomen et al. | 148/187 |
| 4,426,764 | 1/1984 | Kosa et al. | 148/187 |
| 4,517,225 | 5/1985 | Broadbent | 427/89 |
| 4,612,257 | 9/1986 | Broadbent | 428/620 |
| 4,720,323 | 1/1988 | Sato | 437/69 |
| 4,822,749 | 4/1989 | Flanner et al. | 437/41 |
| 4,879,257 | 11/1989 | Patrick | 437/192 |

FOREIGN PATENT DOCUMENTS

| | | | |
|---|---|---|---|
| 0195823 | 11/1984 | Japan | 437/192 |
| 60-81842 | 9/1985 | Japan | |
| 63-190357 | 5/1988 | Japan | |
| 63-190358 | 5/1988 | Japan | |
| 63-76453 | 6/1988 | Japan | |
| 63-133551 | 6/1988 | Japan | 437/192 |
| 0011346 | 1/1989 | Japan | 437/40 |
| 0175260 | 7/1989 | Japan | 437/40 |
| 86/01639 | 3/1986 | PCT Int'l Appl. | |
| 88/04831 | 6/1988 | PCT Int'l Appl. | |

OTHER PUBLICATIONS

"Plasma Etching Methods for the Formation of Planarized Tungsten Plugs Used in Multilevel VLSI Metallizations", Saia et al., Solid-State Science and Tech., vol. 135, No. 4, pp. 936-940 (Apr. 1988).

"High Conductivity Diffusions and Gate Regions Using Self-Aligned Silicide Technology", Osburn et al., VLSI Science and Tech. (1982).

Primary Examiner—Brian E. Hearn
Assistant Examiner—Trung Dang
Attorney, Agent, or Firm—Ernestine C. Bartlett

[57] ABSTRACT

A method of making planarized metallization on a semiconductor substrate employing selective deposition.

11 Claims, 7 Drawing Sheets

METHOD FOR SELECTIVELY FILLING CONTACTS OR VIAS OR VARIOUS DEPTHS WITH CVD TUNGSTEN

BACKGROUND OF THE INVENTION

This invention relates to the provision of conductive paths between devices and a metallization layer or between metallization layers of integrated circuits, and to a process for forming such conductive paths or electrically conductive plugs by the selective deposition of tungsten.

In an integrated circuit, the devices and elements formed in the substrate are interconnected with metallic (e.g. aluminum) leads which are typically formed by sequential deposition, masking and etching, generally referred to as metallization. Such metallization usually provides for a layer of metallization on top of a layer of insulating oxide or glass and the insulating oxide on which the metal is deposited generally includes openings or windows for the formation of metallized contacts to silicon or polysilicon, or metallized vias to another layer of metallization.

Tungsten is employed for various purposes in manufacturing semiconductor integrated circuits. For example, in making such integrated circuits and other solid state devices, the tungsten serves to wire the electrical contacts required between an overlying conductive layer and an underlying region separated therefrom by a layer of dielectric material. The overlying layer is typically a metal and the underlying region is typically a doped semiconductor region, salicide, or another metal layer. The contact between the overlying and underlying materials is through the conductive filled openings or windows commonly referred to as "vias" (when the wiring is of metal to metal) or "contacts" (when the wiring is to source-drain, salicide, or polysilicon).

It is known to provide for conductive filled contact and via openings to allow for openings of reduced size and to allow for greater device densities.

One approach to filling such openings is described in Saia et al, "Plasma Etching Methods for the Formation of Planarized Tungsten Plugs Used in Multilevel VLSI Metallizations", J. Electrochem. Soc.: *SOLID-STATE SCIENCE AND TECHNOLOGY*, Vol. 135, No. 4, pp. 936-940 (April, 1988) and is illustrated and described hereinafter in the description of FIGS. 1A to 1D.

Another approach to filling such openings is described in Farb, PCT International Publication Number WO 88/04831 published June 30, 1988 and is illustrated and described hereinafter with reference to FIGS. 2A-2G.

Yet another approach to filling such openings is disclosed in Shoji Madokoro, Japanese patent publication Kokai No. 63-764563, Apr. 6, 1988, (Application Ser. No. 61-219644 filed Sept. 19, 1986) entitled "Manufacture of Multilayer Interconnection" and is illustrated and described hereinafter with reference to FIGS. 3A-3D.

Various problems exist with such prior art techniques particularly when filling multiple apertures of varying depths primarily because the various depths are filled to overflowing and have to be etched back to provide a planar surface. All of such techniques generally require additional expensive and time-consuming steps of deposition; masking and etching steps to remove "nail heads" or overflow of material; or such techniques must align critical contacts more than once, or rely on uniform sidewall nucleation in a selective mode, etc.

SUMMARY OF THE INVENTION

An object of this invention is to provide a semiconductor device having conductive paths between semiconductor regions and a metallization layer or between metallization layers of integrated circuits obtained by a simplified method in which etch-back planarization is not needed after deposition of the tungsten; alignment of critical contacts more than once is not necessary; and uniform sidewall nucleation in a selective mode is not essential.

In accordance with the invention, metallization to exposed regions of a semiconductor device is provided by a method which includes the steps of:

(a) providing a substrate comprising a planarized surface disposed over at least two conductive, preferably semi-conductive regions, said surface having at least one first relatively shallow aperture and at least one second relatively deeper aperture disposed over and exposing said semiconductor region, and/or conducting regions of said device;

(b) selectively depositing a conductive material to fill said first shallow aperture and to partially fill said second deeper aperture;

(c) depositing a dielectric material, for example, a nitride or oxide, over at least said filled first shallow aperture;

(d) applying a mask to said nitride or oxide layer surface;

(e) removing portions, preferably selected portions, of the nitride or oxide layer overlying the partially filled deeper aperture to expose conductive material already deposited therein;

(f) selectively depositing an additional amount of conductive material to substantially complete the filling of at least said second deeper aperture;

(g) repeating steps (b) to (f) until all apertures of relatively greater depth have been substantially completely filled; and (h) selectively removing at least portions of the nitride or oxide layer overlying the previously filled relatively shallow aperture and subsequently filled deeper apertures to provide a planarized surface comprising deposited planarized conductive plugs.

More specifically and preferably, the apertures are disposed over a metal layer and a refractory metal silicide or salicide layers laid down over polysilicon and source-drain regions of a semiconductor device and the deposited conductive material is tungsten.

In a variation of the method of the invention steps (a) to (c) described above are repeated wherein a nitride layer is deposited in step (c), and an oxide layer is laid down on the nitride layer; a wet etch is applied to the oxide layer to expose the nitride on the sidewalls of the deeper aperture; the resist (mask) is removed; the nitride is removed from the deeper aperture including the sidewall thereof; the deeper aperture is filled substantially completely with selectively deposited tungsten; and the nitride and oxide layers (the NOX) are removed.

BRIEF DESCRIPTION OF THE DRAWING

The invention will now be described in terms of preferred embodiments in connection with the drawings in which:

FIGS. 4A–4G schematically illustrate one embodiment of the present invention.

DETAILED DESCRIPTION OF PREFERRED EMBODIMENTS

Figure 1A:
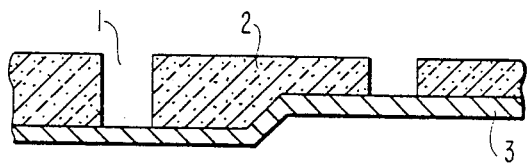
FIGS. 1A–1D, 2A–2G, and 3A–3D schematically illustrate various prior art techniques for filling vias and or contacts to semiconductor material.
Figure 1B:
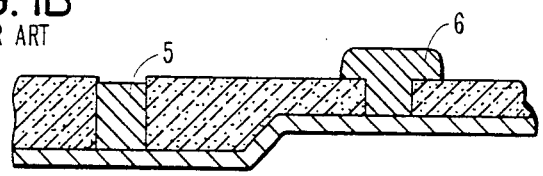
Figure 1C:
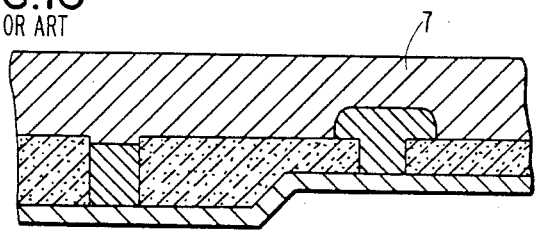
Figure 1D:
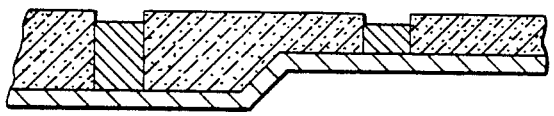

Referring to FIG. 1A–1D, in one prior art technique, in a VLSI multilevel metal structure for example, the vias 1 between two levels of metal interconnect metal layer 3 and layer 4 (not shown) in a multilevel metal system. The vias are filled using either selective or non-selective chemical vapor deposited (CVD) tungstens. In this procedure, as illustrated in FIG. 1A, vias are patterned and etched; tungsten 5 is selectively deposited leaving a nailhead 6 over the shallow aperture (FIG. 1B); and photoresist planarization and plasma etch back is performed to provide a planarized surface (FIGS. 1C and 1D). Such a procedure is described in the Saia et al J. Electrochem. Soc. article referred to above wherein it is disclosed that if the tungsten is deposited in vias of different depths on the chip, the shallow vias must be overfilled in order to completely fill the deep vias. The resultant tungsten "nailheads" must then be removed using photoresist planarization and plasma etch back.

Figure 2A:
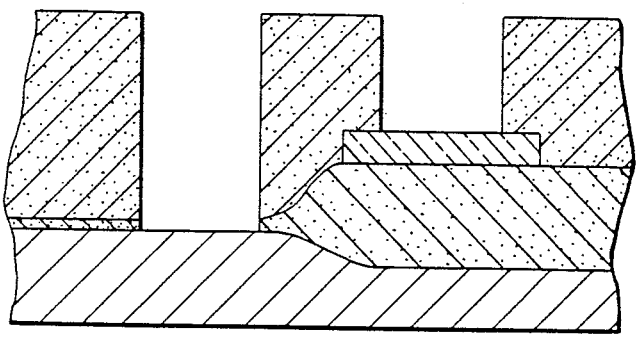
Figure 2B:
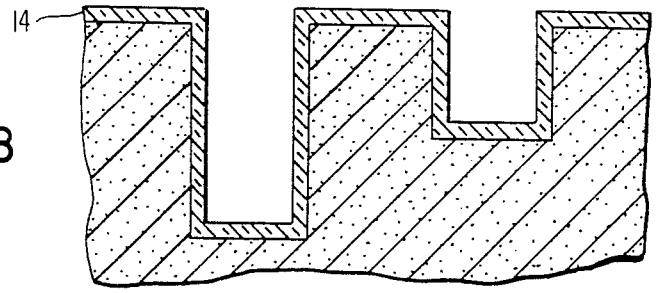
Figure 2C:
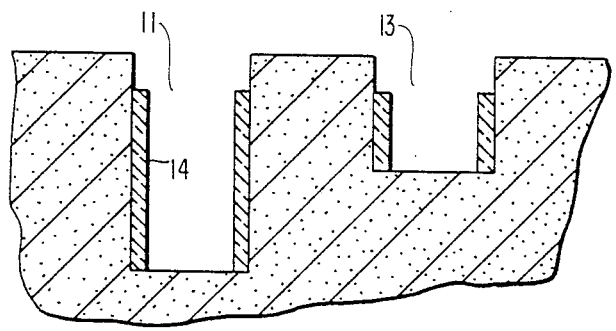
Figure 2D:
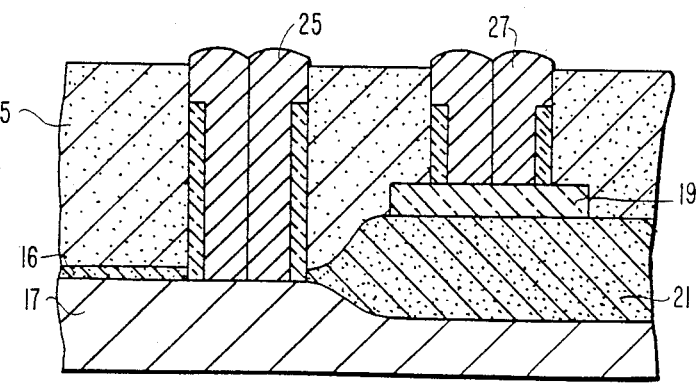
Figure 2E:
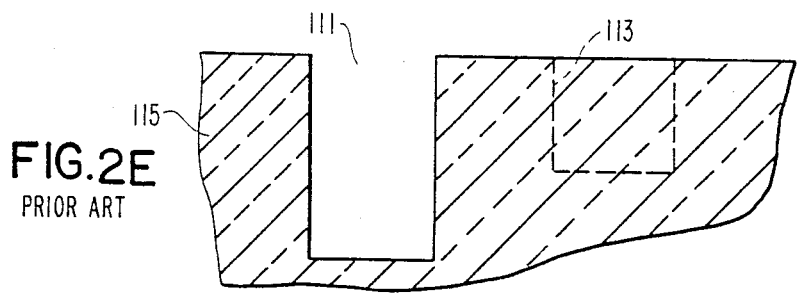
Figure 2F:
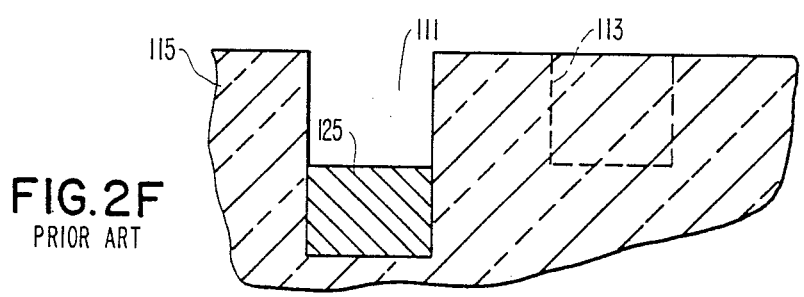
Figure 2G:
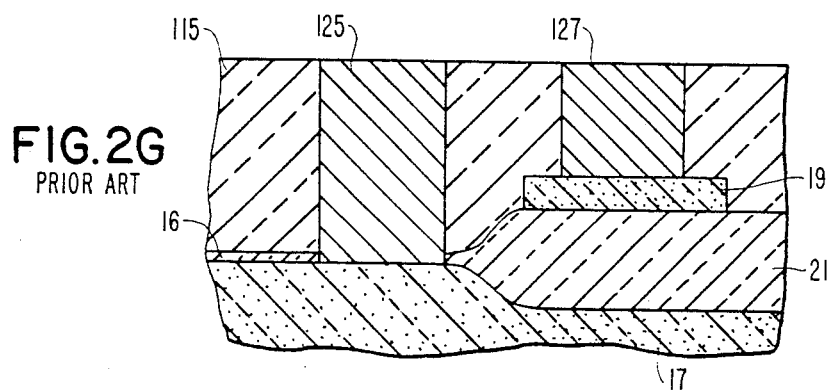
Figure 3A:
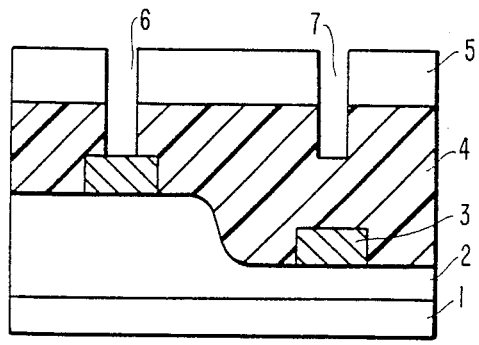
Figure 3B:
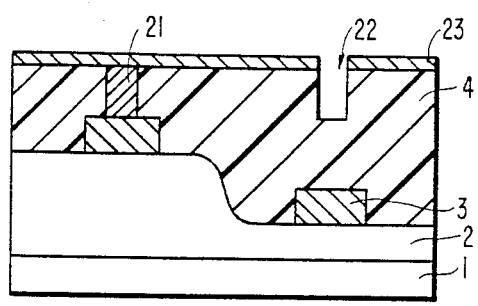
Figure 3C:
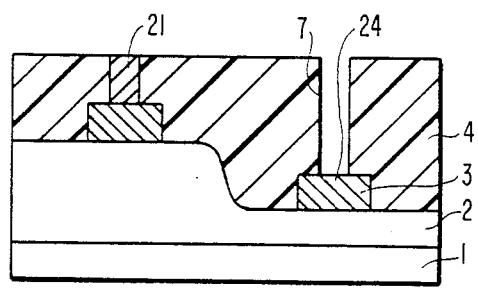
Figure 3D:
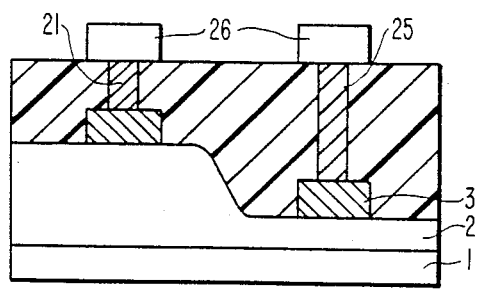
Figure 4A:
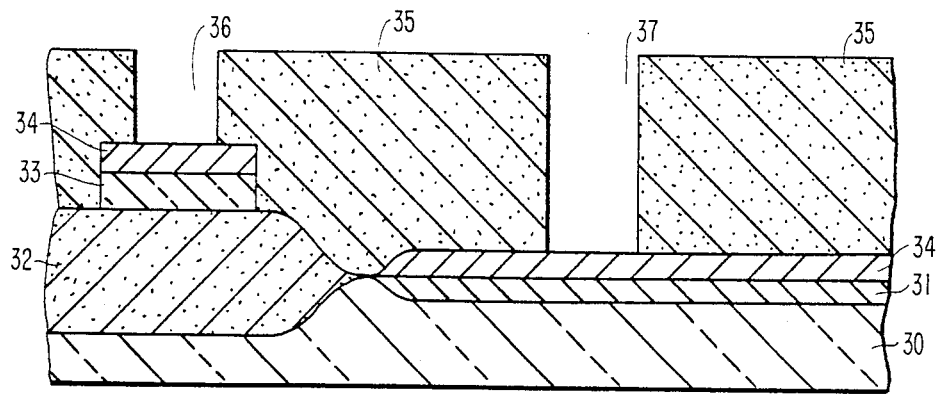
Figure 4B:
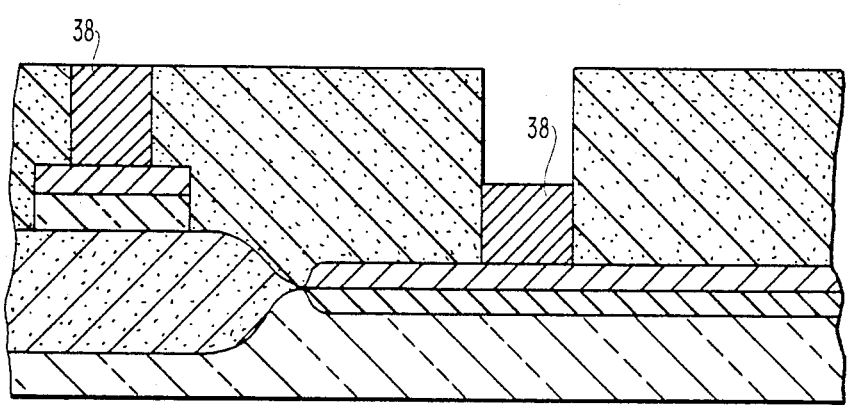
Figure 4C:
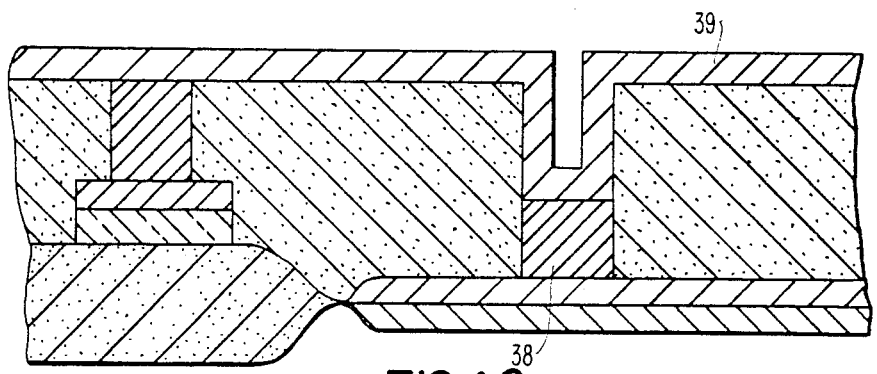
Figure 4D:
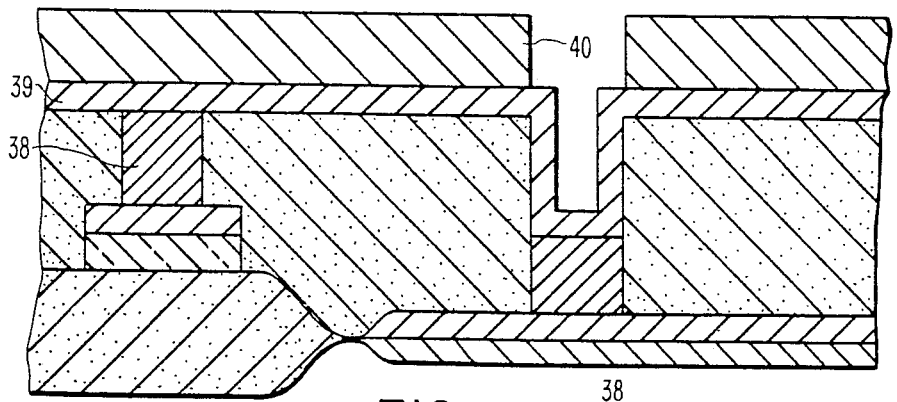
Figure 4E:
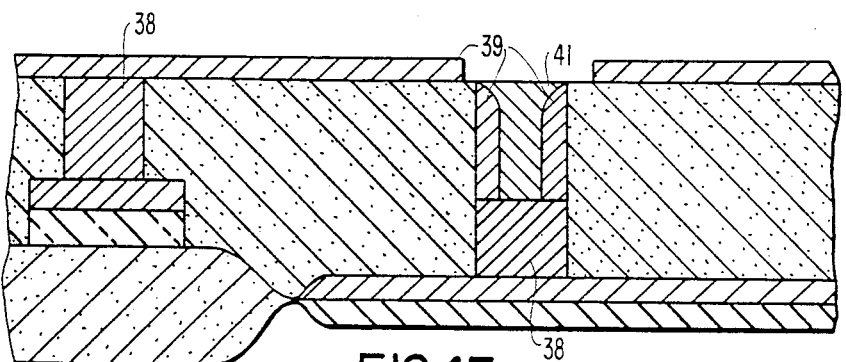
Figure 4F:
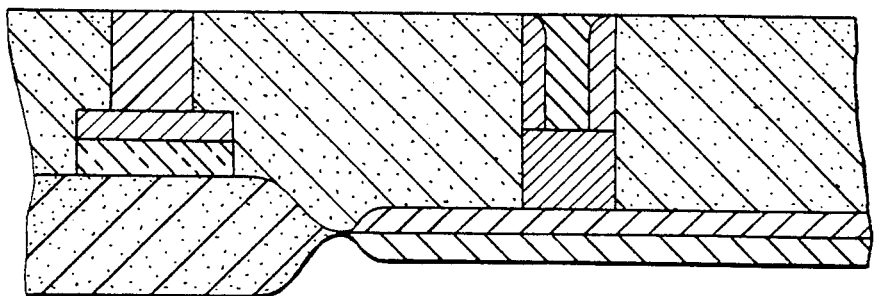

Another prior art technique for filling vias is disclosed in PCT publication No. WO88/04831 referred to above and illustrated in FIGS. 2A–2G wherein the process includes the steps of forming first one or more openings 11 of a first predetermined depth in a planarized oxide layer 15 (FIG. 2A) which overlies gate oxide 16 laid down on substrate 17 and forming a second opening 13 which overlies polysilicon 19 laid down on field oxide 21. Silicon 14 is then deposited to cover the walls of the openings (FIG. 2B) after which the silicon is etched from all but a portion of the opening sidewalls, an over-etch being used so that the deposited silicon layer 14 in the upper portions of the openings 11 and 13 is removed to result in the structure of FIG. 2C. The over-etch prevents overfilling the openings 11 and 13 with tungsten which is selectively deposited in the next step. After the etching, one or more openings are filled with conductive material 25, 27 to substantially the same level as the adjacent surfaces of the oxide layer to form respective planarized conductive plugs (FIG. 2D). Since tungsten deposits selectively to silicon and metal, the CVD deposited tungsten will only deposit on the silicon 14. Alternatively, first one or more openings 111 of a first predetermined depth are formed in a planarized oxide layer 115 (FIG. 2E); the first one or more openings are partially filled with conductive material 125 to a level corresponding to a second predetermined depth (FIG 2F); second one or more openings 113 of the second predetermined depth is formed in the planarized oxide layer; and the first and second one or more openings is filled with conductive material 125 and 127, to substantially the same level (FIG. 2G).

In this technique a specific and precise mask and etch procedure is necessary for each contact or via opening. Moreover, it appears that a great deal of precision in application is required since it is necessary to first form and partially fill the first opening 111 (which is greater in depth that the depth of a second opening 113 that is to be formed subsequently) to a depth of the partially filled opening that is the same as the contemplated depth of the future opening. In other words, a deeper hole is first formed and partially filled and then the shallow hole is formed and filled while completing the fill of the second shallow hole. Obviously the first filling step must be precisely and accurately performed since either too little or too great a fill when partially filling the deeper hole will result in a non-planarized surface after the second shallower hole is formed and filled. There are additional inherent difficulties associated with the necessity to form and fill the second shallower aperture that will be readily apparent to those skilled in the art.

Yet another prior art technique is disclosed in Japanese Kokai No. 63-764563 referred to above and illustrated in FIGS. 3A–3D wherein multilayer interconnections 3, 26 with contacts or vias 6, 7 of different depth are made in an insulating film 4. In the technique, shallow via 6 is completely made and a metal 21 is selectively deposited therein. Then a second metal 23 is evaporated on the surface to etch the deeper via 7 using the evaporated metal 23 as a mask. Then metal 25 is catalytically deposited in and fills the deeper via 7. This technique thus sequentially etches the shallow via and partially etches the deeper via; fills the shallow via; masks the shallow via; completes the formation of the deeper via and then fills the deeper via and otherwise involves a technique and considerations that involve time-consuming and expensive steps or are otherwise problematic.

Referring to FIGS. 4A–4F, an embodiment of the invention is now described. There is shown a body of silicon 30 having already formed therein source-drain region 31, field oxide region 32, polysilicon gate 33 on top of the field oxide 32 and salicide elements 34 on top of polysilicon gate 33 and source drain region 31, respectively, located on the silicon body 30. Shallow opening (vias or contacts), 36 and deeper opening 37 are formed, for example by appropriate masking and etching in a planarized oxide layer 35. The sides of the openings 36 and 37 are vertical while the bottoms of the openings and the tops of the areas between and adjacent the openings are horizontal. The openings 36 and 37 may be the same or different diameter. The opening 36 exposes a portion of the salicide 34 and the opening 37 exposes a portion of the salicide 34. Tungsten 38 is then deposited by chemical vapor deposition. As is known, tungsten selectively deposits to silicon, certain silicides, and metal. The tungsten is preferably deposited using chemical vapor deposition (CVD) by means well known in the art and is deposited to fill the shallow via 36 while substantially simultaneously partially filling the deeper via 37.

As used herein, the term salicide refers to self-aligned silicide technology as is well known in the art. Such technology is as described, for example, in Osburn et al, "High Conductivity Diffusions and Gate Regions Using Self-Aligned Silicide Technology", VLSI Science and Technology, pp. 213–223, (1982) (Proc. of the 1st International Symposium on VLSI Science and Technology; Oct. 18–21, 1982, Detroit, Mich). One such technique described therein for producing salicides and incorporated herein by reference comprises the steps of forming a standard device by (a) deposition and patterning of an oxide/nitride oxidation mask layer, (b) ion implantation to tailor field threshold voltage; (c) field oxidation; (d) removal of the oxidation mask; (e) gate oxide growth; (f) enhancement mode ion implantation; (g) depletion mode masking and ion implantation; (h) poly-Si deposition and doping; (i) sidewall spacer formation; (j) source-drain formation and (k) silicide formation wherein a silicide forming metal is deposited and reacted to form metal silicide over silicon-containing regions after which it is selectively etched to leave behind only the silicide areas.

Referring now to FIGS. 4C to 4F, after the first deposition of tungsten, a dielectric, for example nitride layer 39, for example, silicon nitride, or an oxide layer 39 is applied and the structure is next formed into a pattern by applying a photoresist layer 40 on the surface of the deposited nitride layer 39 and patterning the photoresist to mask the surface whereby the nitride layer is then etched to open the deeper contacts to expose the previously deposited tungsten 38 in the deeper via 37. At this point, the photoresist is stripped and tungsten 41 is selectively deposited to completely fill the deeper via 37. Surface nitride 39 is then stripped and aluminum or other metal (not shown) is then deposited.

Figure 5A:
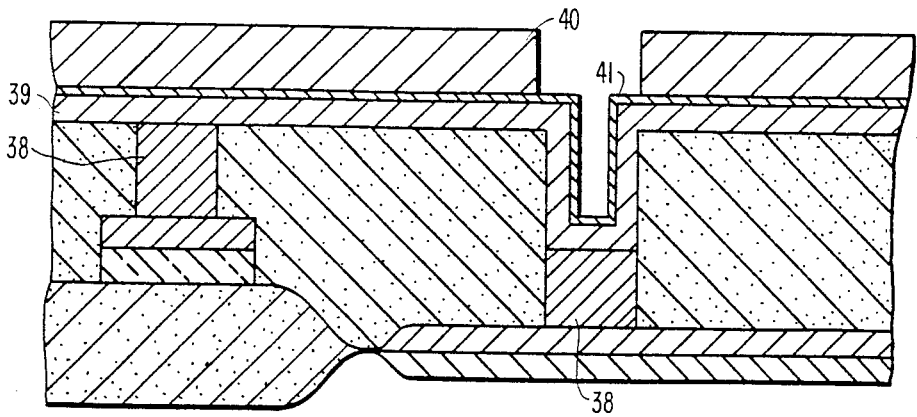
FIGS. 5A–5C illustrate an alternate embodiment of the present invention.
Figure 5B:
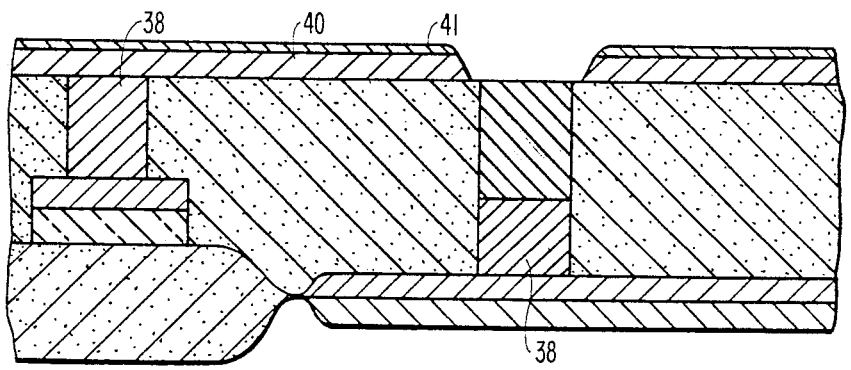
Figure 5C:
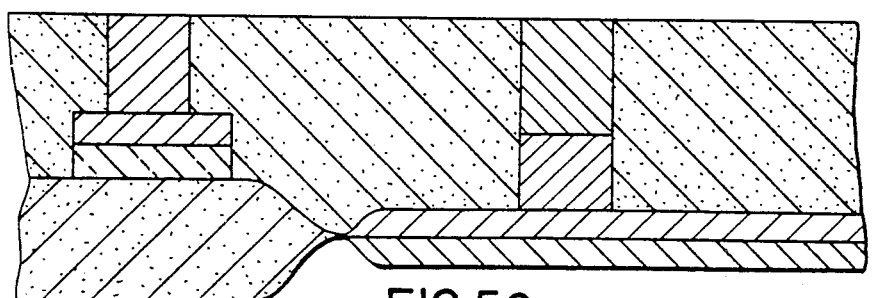

Referring to FIGS. 5A–5C, there is shown an alternative embodiment of the invention wherein plasma nitride 39 is deposited after which plasma oxide 41 (NOX) is deposited on the plasma nitride layer; using a noncritical mask 40; contacts are opened; the NOX is wet etched; and the nitride is isotropically etched and thereby completely removed from the sidewalls using the NOX as a mask (FIG. 5A). Subsequently, tungsten is selectively deposited to fill the remaining contact depth (FIG. 5B); the NOX and nitride are stripped (FIG. 5C); and aluminum is deposited (not shown). It will thus be seen that a structure is produced that is free of nitride on the via sidewalls.

It will be apparent that in the above description:

The semiconductor body is typically a silicon substrate or epitaxial layer formed thereon. Other semiconductor materials including Group III–V materials, are possible. The semiconductor body may consist simply of a P-type or N-type doped substrate.

Salicides 34 used in this invention may be the same or different.

The tungsten may be deposited by any suitable means and is preferably deposited by chemical vapor deposition by means well known in the art.

The vias or contacts are formed primarily by anisotropic etching using etchants and techniques well known in the art.

The photoresist and other masks employed during the technique may be non-critical masks.

Preferably, during the technique described in FIGS. 5A and 5B, a hot phosphoric acid etch or isotropic dry etch is utilized to remove the nitride from the exposed contacts.

While the invention has been illustrated in terms of salicide layers, it will be understood that any selective material on which tungsten will deposit may be substituted. Suitable materials include a refractory metal silicide, may contain silicon, titanium nitride, tungsten disilicide, a titanium-tungsten alloy, tungsten, aluminum, molybdenum, etc.

Moreover, while the foregoing techniques have been directed to the use of tungsten for the selective deposition on certain materials such as metal and silicon, other conductive materials such as molybdenum which selectively deposit can also be used.

It will be clear from the foregoing that a simple, efficient and reliable method for providing conductive plugs filling and producing planarized contact and via openings has been provided in which greater device density may be obtained as a result of the flexibility afforded to aperture location, reduced spacing between apertures, and reduced aperture size, all of which are made possible by the techniques of the present invention.

Although the foregoing is a description of specific embodiments, various modifications and changes thereto will be apparent that do not depart from the scope and spirit of the invention as defined by the appended claims.

I claim:

1. A method for forming metallization to exposed semiconductor regions of a semiconductor device comprising the steps of:
   (a) providing a substrate comprising a planarized surface disposed over at least two conductive regions, said surface having at least one first relatively shallow aperture and at least one second relatively deeper aperture disposed over and exposing said conductive regions;
   (b) selectively depositing a conductive material to fill said first shallow aperture and to partially fill said second deeper aperture;
   (c) depositing a dielectric layer over at least said filled first shallow aperture;
   (d) removing portions of said dielectric layer overlying the partially filled deeper aperture to expose conductive material deposited therein;
   (e) selectively depositing an amount of conductive material to substantially complete filling of said second deeper aperture;
   (f) sequentially applying steps (b), (c), (d) and (e) to additional relatively shallow and relatively deeper apertures present in said surface, if any, until each such aperture is filled; and
   (g) selectively removing at least portions of the dielectric layer overlying the previously filled and last filled apertures to provide a planarized surface.

2. A method as claimed in claim 1 wherein the conductive material is tungsten.

3. A method as claimed in claim 2 wherein said substrate is silicon comprising a silicon dioxide planarized surface disposed over salicide layers overlying polysilicon and source-drain regions, respectively.

4. A method as claimed in claim 3 wherein said apertures are vias and contacts.

5. A method for forming metallization to exposed semiconductor regions of a semiconductor device comprising the steps of:
   (a) providing a substrate comprising a planarized surface disposed over at least two conductive regions, said surface having a first shallow aperture and a second deeper aperture disposed over and exposing said conductive regions;
   (b) selectively depositing a conductive material to fill said first shallow aperture and to partially fill said second deeper aperture;
   (c) depositing a dielectric layer over at least said filled first shallow aperture;
   (d) masking the dielectric layer;
   (e) selectively removing portions of the dielectric layer overlying the partially filled second deeper aperture to expose conductive material already deposited therein;
   (f) selectively depositing an additional amount of conductive material to substantially completely fill the second deeper aperture; and (g) selectively removing at least portions of the dielectric layer overlying said first filled shallow aperture to provide a planarized surface.

6. A method as claimed in claim 5 wherein the conductive material is tungsten.

7. A method as claimed in claim 6 wherein the apertures are disposed over and expose salicide layers laid down over a polysilicon gate and a source-drain layer, respectively.

8. A method as claimed in claim 5 wherein a nitride layer is applied in step (c); an oxide layer is deposited on said nitride layer and a photoresist mask is applied thereto; a wet or isotropic dry etch is applied to the oxide layer to expose the nitride on the sidewalls of said second deeper aperture; and the nitride is isotropically removed from the second deeper aperture including the sidewalls thereof.

9. A method as claimed in claim 1 wherein a metal is applied to the planarized surface produced in step (g).

10. A method as claimed in claim 5 wherein a metal is applied to the planarized surface produced in step (g).

11. A method as claimed in claim 10 wherein said metal is aluminum.

* * * * *